United States Patent [19]

Malcolm

[11] Patent Number: 4,494,651
[45] Date of Patent: Jan. 22, 1985

[54] ELECTRICALLY CONDUCTIVE ANTI-STATIC WORK STATION

[75] Inventor: Donald A. Malcolm, Roanoke Rapids, N.C.

[73] Assignee: W. R. Grace & Co., Cryovac Div., Duncan, S.C.

[21] Appl. No.: 484,321

[22] Filed: Apr. 19, 1983

[51] Int. Cl.$^3$ ............... B65D 81/02; B65D 65/18; H05F 3/02
[52] U.S. Cl. ................... 206/328; 206/45.34; 206/334; 220/82; 361/212
[58] Field of Search ............ 206/328, 334, 349, 45.34; 361/212; 220/82

[56] References Cited

U.S. PATENT DOCUMENTS

| | | |
|---|---|---|
| 2,962,161 | 11/1960 | Lacy . |
| 3,317,955 | 5/1967 | Schurman . |
| 3,355,313 | 11/1967 | Eastes . |
| 3,452,125 | 6/1969 | Schurman . |
| 4,171,049 | 10/1979 | Nohara .. |
| 4,198,452 | 4/1980 | Olcott . |
| 4,268,539 | 5/1981 | Nakayama . |
| 4,274,537 | 6/1981 | Cooper . |
| 4,303,554 | 12/1981 | Sudo . |
| 4,327,832 | 5/1982 | Matteo ........................... 206/328 |
| 4,333,565 | 6/1982 | Woods . |
| 4,340,139 | 7/1982 | Wilcox et al. ................... 206/349 |
| 4,369,208 | 1/1983 | Okunaka . |
| 4,374,227 | 2/1983 | Michie . |
| 4,444,827 | 4/1984 | Swaroop . |

FOREIGN PATENT DOCUMENTS 810595  4/1969  Canada .
181097  5/1956  Japan .

OTHER PUBLICATIONS

Western Electric Bulletin, I.C. Shipping Package, 4/1973 Egan et al.; copy in 206-328.
IBM Bulletin, Protective Container For I.C. Modules, Capousis et al.; 3/1975, vol. 17; Copy in 361-212.
IBM Bulletin, Module Substrate Case; Avazian et al., vol. 24, No. 1A 6/1981; Copy in 206-328.

Primary Examiner—William T. Dixson, Jr.
Attorney, Agent, or Firm—John J. Toney; William D. Lee, Jr.; Mark B. Quatt

[57] ABSTRACT

A portable work station for transporting a device sensitive to external electrical forces and, in particular, to static electricity is provided. The work station which is manufactured from an electrically conductive composition which acts to shield the contents of the container from external electrical forces is provided with an electrically conductive window means and electrical charge grounding means all of which are in electrically conductive communication with each other. In one embodiment the work station is provided with an internal electrically conductive anti-static pad.

13 Claims, 12 Drawing Figures

ELECTRICALLY CONDUCTIVE ANTI-STATIC WORK STATION

FIELD OF THE INVENTION

The field of the present invention encompasses portable containers for transporting an electrically sensitive device. In particular, the field of the present invention includes containers which, while closed, protectively shield their contents from potentially harmful external electrical forces.

BACKGROUND OF THE INVENTION

When two bodies, particularly of unlike materials, are brought together into intimate contact, there is likely to be a redistribution of electrons across the interface and an attractive force is established as equilibrium is achieved. When the bodies are separated, work must be done in opposition to these attractive forces. The expended energy reappears as an increase in electrical tension or voltage between the two surfaces and the surfaces are said to be electrically charged with respect to each other. If a conductive path is available, the charges thus separated will reunite (e.g. equilibrate) immediately. If no such path is available, as would be the case with insulators or non-conductors, the potential increase with separation may easily reach values of several thousand volts. A charge may be either positive (+) or negative (−) denoting a deficiency or excess of electrons, respectively. A surface that has an excess or deficiency of one electron in every one hundred thousand atoms is strongly charged.

Like charges repel each other and unlike charges attract because of forces resident in the electrical fields that surround them. Accordingly, as a result of the repulsive forces associated with like charges, it is apparent that the charge on a charged object will be located on the exterior surface thereof. These forces have a strong influence on nearby objects. If the neighboring object is a conductor it will experience a separation of charges by induction. Its repelled charge is free to give or receive electrons as the case may be; if another conductor is brought near, the transfer may occur through the agency of a spark, very often an energetic spark. Such charge transfer actions are known to adversely affect or even electronically destroy a number of electronic devices which are sensitive to electricity and, for example, static electricity. Microcircuit devices such as integrated circuit chips, for example, may be damaged by electrostatic discharge prior to their incorporation into electrical or electronic equipment.

In order to prevent electrostatic breakdowns, containers, in which such devices are stored and even transported, have been provided with means for short-circuiting the device terminals or pins during storage. This short-circuiting serves to prevent the accumulation of potentially damaging static charges on the device. The container represented in U.S. Pat. No. 4,171,049 accomplishes this task by utilizing a series of conductive slots or grooves into which a number of static electricity sensitive devices maybe serially inserted and later serially dispensed to manufacturing equipment. Other containers have been developed for portable use as in the device replacement market. These containers have taken the form of small, box-like containers that may house conductive sponge or foam sheets into which the device terminals may be temporarily embedded. Exemplary of such a container is the container disclosed in U.S. Pat. No. 4,333,565.

Containers which are to be utilized for storage and transportation of repair or replacement electrically sensitive devices to an on-site field location should possess several characteristics and/or capabilities some of which are quite different from those which are normally associated with containers utilized for storing and sorting devices for incorporation into originally manufactured equipment. For example, besides possessing the ability to inhibit electrostatic charge buildup and shielding the contents from electrical fields the portable containers or work stations should also provide protection from mechanical shock and vibration. Furthermore, the portable containers should be of light weight construction and easy to use when gaining access to the equipment which is to be repaired. Another desirable feature of such a portable container is its capability of storing static sensitive devices of different sizes and shapes without an attendant change in size or shape in the container itself. Reusability and tamper security are still other desirable qualities. Of course, cost economy is also very important.

Unfortunately, the prior portable containers which have heretofore been utilized in storage and transportation of static electricity sensitive devices for field use have been lacking in a number of the above described perferred physical characteristics and capabilities. This situation may be attributable to the fact that many of these containers were specifically designed for on-line in-factory use in the original manufacture of electronic or electrical equipment systems. Thus, these containers did not have to meet many of the requirements which were necessary or, at least, highly desirable in a portable container. Exemplary of the shortcomings of the on-line containers was the fact that, in general, the containers were designed so that each type of container would contain only one particular electrically sensitive device. Accordingly, the type of electrically sensitive device contained within the container would be known by merely viewing the physical configuration or other indicia located on the exterior of the container. This system of identification was believed necessary since unnecessary opening of the container to view the electrically sensitive devices was undesirable since the act of opening the container destroyed the shielding effect of the container. This situation also led to difficulties since a great number of different container designs or sizes became necessary to identify all of the various different types of electrically sensitive devices. While such a situation, although not preferable, may have been tolerable in the on-line in-plant manufacturing situation where ample storage facilities were readily available, such an identification system was clearly unsatisfactory for field repair situations since the repair technician could not physically carry such a vast array of cases with him for on-site repair. Accordingly, the repair technician generally had to carry several different devices within a single container and, in many cases, had to carry several containers each containing differing electrically sensitive devices. This development resulted in an identification problem since the case which shielded the electrically sensitive device from the possible harmful effects of external electrical forces had to be opened by the field technician in order to ascertain the location of a given electrically sensitive device. In many instances such action unnecessarily subjected the electrically sensitive devices to potentially hazardous electrical fields or charges and rendered the devices electrically defective. This situation was undesirable in that the devices were unnecessarily destroyed and the repair time was extended in that new repair parts would have to be obtained.

Accordingly, the need for a container which effectively shielded electrically sensitive devices from the adverse effects of external electrical forces and static charges wherein the container was provided with a window for viewing and identifying the contents without opening of the container arose. Of course the window portion of the container, as is the case with the remaining enclosure portion of the container, had to be electrically conductive and in electrical conductive communication with the remainder of the container for the shielding effect of the container to be complete. Normal glass could not be utilized as a window material since glass is a non-conductive material and static electric charges could build up thereon. Furthermore, external electrical fields could penetrate the interior of the container by way of the glass window. The presence of an electrical charge on the window portion of the container and/or electrical penetration of the interior of the container could well adversely effect the electrically sensitive devices contained therein.

OBJECTS OF THE PRESENT INVENTION

Accordingly, it is a general object of the present invention to provide an improved electrically conductive container for electricity sensitive devices.

More specifically it is an object of the present invention to provide a container for shipping and storing static electricity sensitive devices.

Another object of the present invention is to provide a container of the type described of simple, lightweight, and economic construction.

Yet another object of the present invention is to provide a container of the type described that is capable of effeciently housing devices of different sizes and shapes.

Still another object of the present invention is to provide a conductive container of the type described in which several different electrically sensitive devices may be stored yet individually be identified and later removed.

An even further object of the present invention is to provide a conductive container for an electrically sensitive device said container having window or viewing means whereby the contents of the container may be viewed and identified without opening the container.

One more object of the present invention is to provide a container for shielding electrically sensitive devices from external electrical forces.

Another object of the present invention is to provide a conductive container for transporting an electrically sensitive device, said container having incorporated therein means for substantially reducing the generation of static electricity charge within the container.

A further object of the present invention is to provide a conductive container for transporting an electrically sensitive device wherein the container is provided with means for equilibrating any electrical charge thereon with the electrical charge present on the machine into which the electrically sensitive device is to be incorporated.

Still further objects and the broad scope of applicability of the present invention will become apparent to those of ordinary skill in the art from the details disclosed hereinafter. However, it should be understood that the following detailed description which indicates several preferred embodiments of the present invention is only given for purposes of illustration since various changes and modifications well within the scope of the present invention will become apparent to those with ordinary skill in the art in view of the following detailed description. Such changes and modifications are encompassed within the scope of the accompanying claims.

SUMMARY OF THE INVENTION

In one preferred embodiment of the present invention a portable work station for transporting a device sensitive to external electrical forces and, in particular, to static electricity is provided. Preferably the work station is in the form of a container comprising top and bottom enclosure means connected by hinge means about which the container may be opened and closed in order to obtain access to the interior thereof. Latch means for releasably securing the top and bottom enclosure means to one another is also preferred. The enclosure means are manufactured from an electrically conductive composition which acts to shield the interior of the container and any contents therein from the potentially harmful effects of external electrical forces.

At least one electrically conductive window means for viewing the interior of the container is provided in at least one of the enclosure means. Preferably the window means is located in the top enclosure means for ease of viewing. However, other locations are possible. The window means comprises an orifice in one of the enclosure means with an optically transparent sheet of an electrically conductive material completely overlying said orifice. Alternatively, the sheet may comprise an electrically non-conductive or insulative material which has been surface coated with an electrically conductive material. The electrically conductive sheet is in electrically conductive communication with the enclosure means so that when the container is closed the interior thereof is completely surrounded by an electrically conductive surface.

The window means may contain electrically conductive means for retainingly engaging the optically transparent sheet to the enclosure means while maintaining electrically conductive communication between the enclosure means and the electrically conductive portion of the sheet.

A preferred sheet comprises a sheet of optically transparent, electrically non-conductive thermoplastic polycarbonate or like material having an electrically conductive surface coating thereon. A preferred electrically conductive surface coating is a sputter coating of an indium tin oxide.

When the window means has been incorporated into the appropriate enclosure means and the enclosure means are closed together, the interior of the container is completely surrounded by an electrically conductive surface. This surface acts to completely shield and protect the contents of the container from the potentially adverse effects of external electrical forces while still allowing the interior and contents of the container to be viewed and identified without the necessity of opening the container.

In an even more preferred embodiment the bottom interior surface of the container is lined or otherwise provided with an electrically conductive foam pad which also is in electrically conductive communication with the enclosure means and which pad also has hydroscopic wetting or other anti-static agents incorporated therein or thereon. The presence of the wetting agents, which attract moisture to the surface of the pad, substantially diminishes the possibility of static electricity being generated in the interior of the container as a result of friction between the electrically sensitive devices and the foam pad supporting the devices. Moreover, since the foam pad has been rendered electrically conductive and is in electrically conductive communication with the enclosure means, any static charge which may be internally generated will harmlessly flow to the surface of the enclosure means.

Yet another preferred embodiment of the container or work station comprises enclosure means which have been provided with a grounding snap means whereby any electrical charge existing on the work station may, by means of an electrically conductive wire attached to said snap, be bled off, i.e. grounded, or brought into equilibrium with the electrical charge existing on the machine to which the contents of the container are to be incorporated. Accordingly, by means of the grounding or charge equalization means the electrical charge on a repair or replacement part and the machine into which the part is to be incorporated will be equilibrated prior to incorporation of the part into the machine. Thus, the repair or replacement part will not be subjected to electrical flow or discharge upon being brought into contact with the machine.

BRIEF DESCRIPTION OF THE DRAWINGS

FIG. I is an isometric view of a preferred embodiment of an electrically conductive work station or container in accordance with the present invention.

FIG. II is a cross-sectional, schematic representation of the shielding effect of the electrically conductive container of FIG. I when the container is placed in an electromagnetic field as represented by the lines of electrical force.

FIG. III is a cross-sectional, schematic representation of the lack of shielding afforded by an electrically non-conductive container when said container is placed in an electromagnetic or electrostatic field as represented by the lines of electrical force.

FIG. IV is a cross-sectional schematic representation of the shielding effect of the electrically conductive container of FIG. I when the container is placed in an electrostatic field as represented by the lines of electrical force.

FIG. V is a top plan view of the electrically conductive container of FIG. I in which the window sheet and sheet engaging and retaining means have been removed.

FIG. VI is a front plan view of the electrically conductive container of FIG. I.

FIG. VII is a left side plan view of the electrically conductive container of FIG. I.

FIG. VIII is a top plan view of a preferred window sheet engaging and retaining means is accordance with the present invention.

FIG. IX is a cross-sectional view of the means of FIG. VIII taken along line A—A in FIG. VIII.

FIG. X is a cross-sectional view of the means of FIG. VIII taken along lines B—B in FIG. VIII.

FIG. XI is a cross-sectional view of the window means area of the top enclosure means of the electrically conductive container of FIG. I with the window sheet and the sheet retaining and engaging means having been horizontally exploded for purposes of clarity.

FIG. XII is a cross-sectional view of a preferred window sheet in accordance with the present invention.

DETAILED DESCRIPTION OF SEVERAL PRESENTLY PREFERRED EMBODIMENTS

Figure 1:
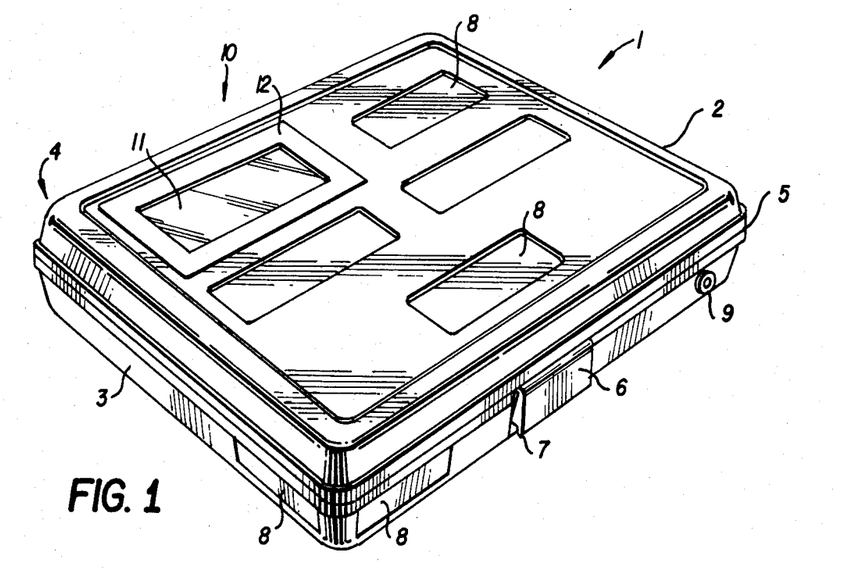
Figure 2:
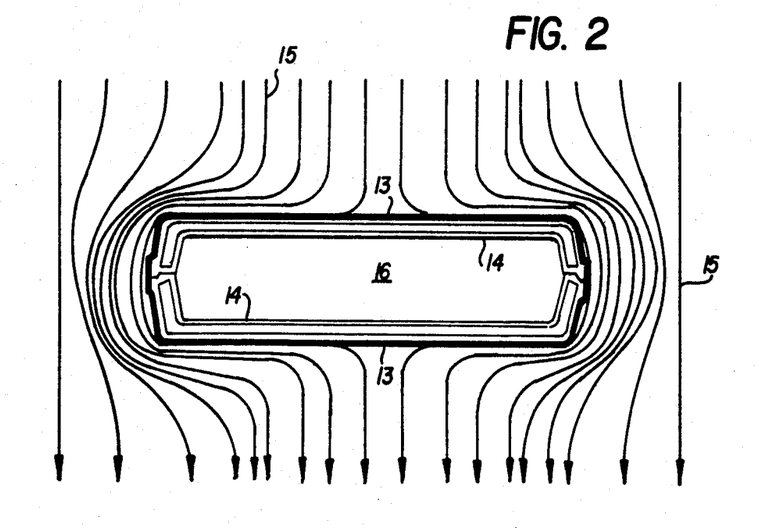
Figure 3:
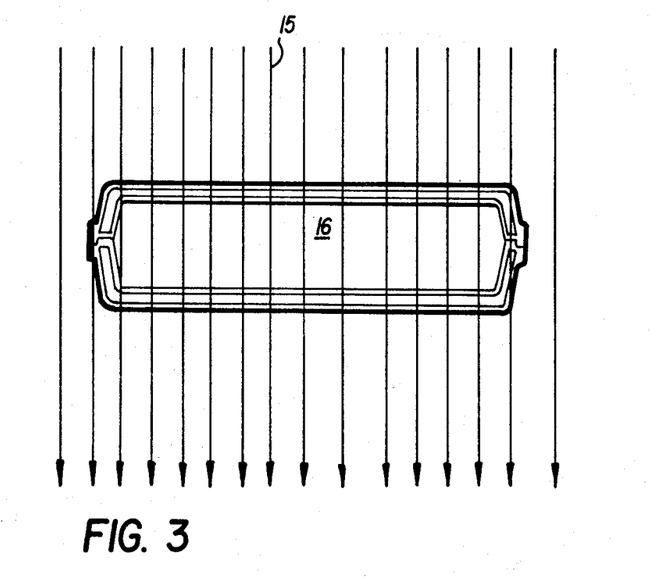
Figure 4:
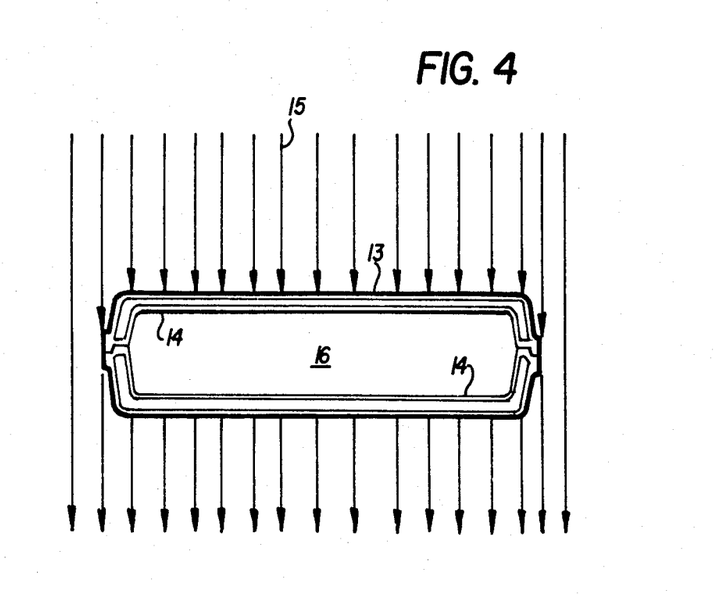
Figure 5:
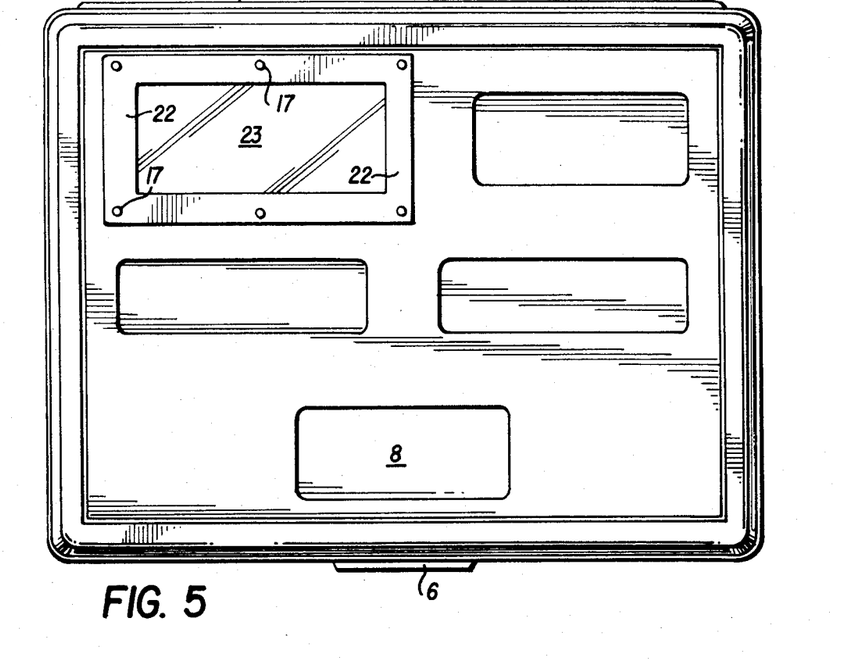
Figure 6:
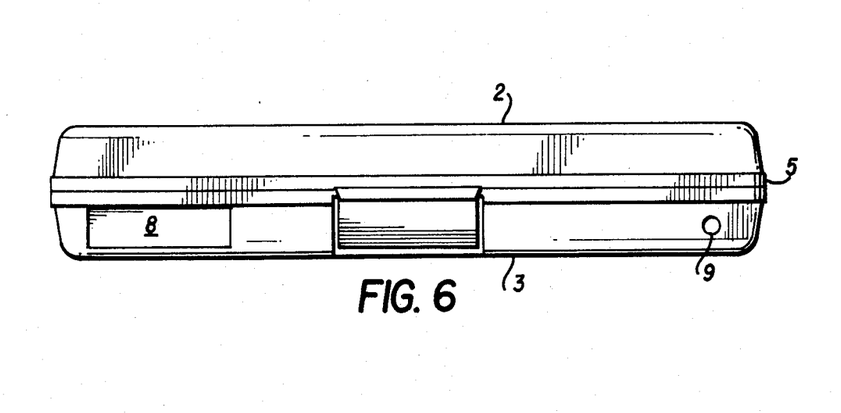
Figure 7:
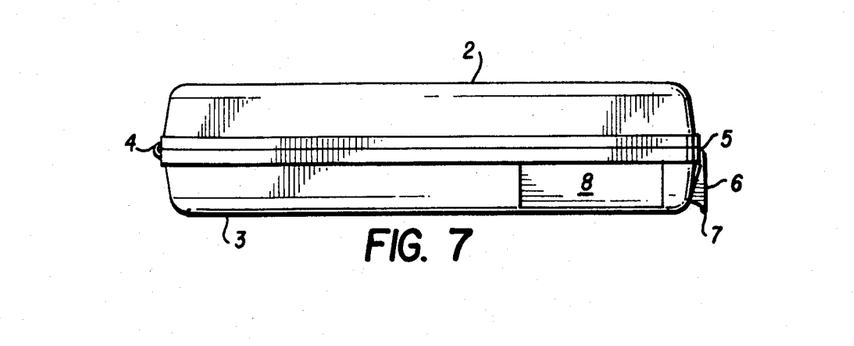
Figure 8:
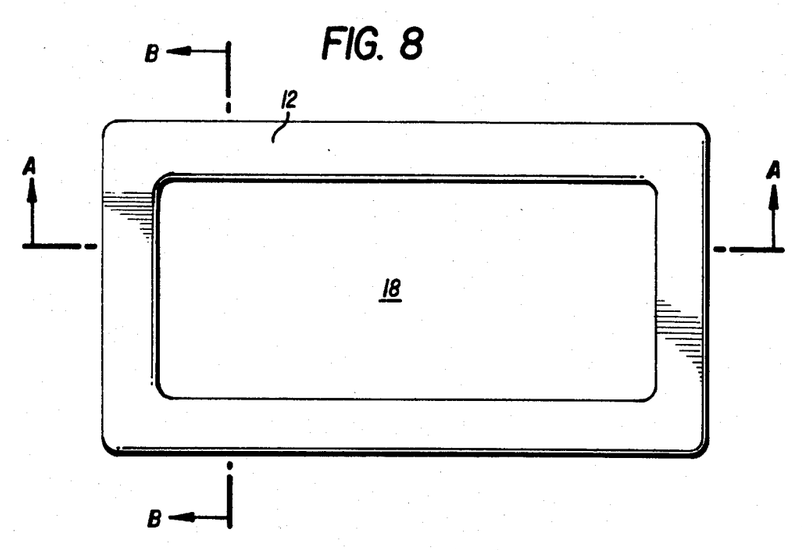
Figure 9:
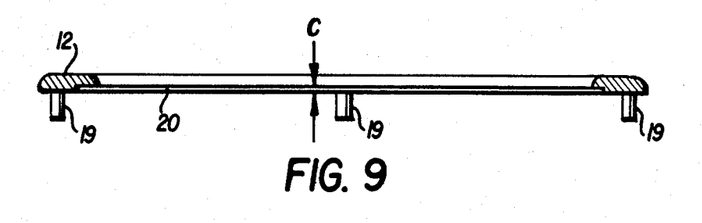
Figure 10:
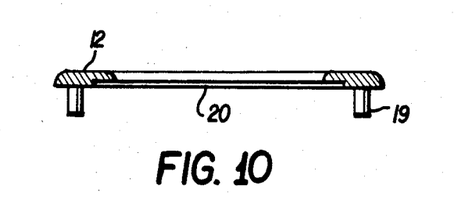
Figure 11:
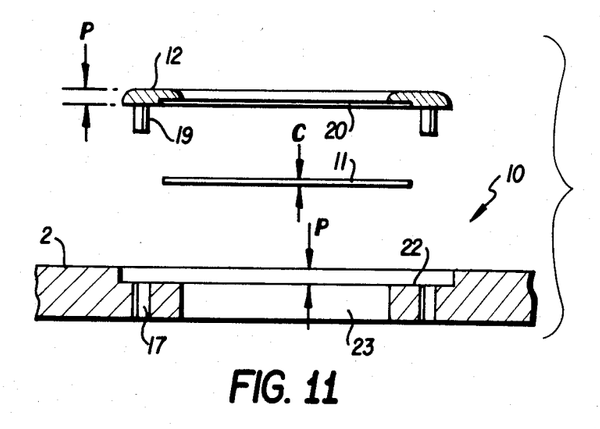
Figure 12:
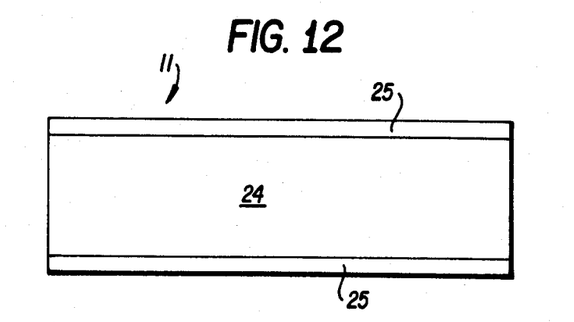

Throughout the drawings like reference numerials represent like structure or means. From FIG. I, which is an isometric view of a preferred embodiment of a portable work station for transporting and/or storing electrically sensitive repair or replacement parts to an on-site field location without subjecting the electrically sensitive repair or replacement parts contained therein to the potentially harmful effects of external electrical forces (fields), it can be seen that the portable work station comprises an electrically conductive container generally designated as at 1. A preferred method of manufacturing the container is blow molding. Blow molding is generally well known to those of ordinary skill in the art. Illustrative patents disclosing blow molding techniques and methods are U.S. Pat. Nos. 3,452,125 and 3,317,955. These documents are hereby incorporated by reference.

The container is manufactured from a blend of (1) any of the conventional thermoplastic materials which have heretofor been utilized in the prior art blow molding processes and (2) particles of an electrically conductive material. Generally, any material which may assume a thermoplastic state can be utilized as the thermoplastic material incorporated within the blend. Such materials are generally blow molded in the temperature range of 250°-600° F. Polyethylene is a preferred material. Other exemplary materials are high-density polyethylene, polypropylene, polyvinyl chloride and elastomeric polyolefins. These materials are generally known not to be electrically conductive. Accordingly, particles of an electrically conductive material must be blended therewith to render the final enclosure composition electrically conductive. Exemplary of such an electrically conductive material is carbon black particles. However, other electrically conductive materials such as, for example, aluminum particles may be utilized. Most metal filings are suitable. However, weight considerations dictate a perference toward lighter particles or filings. A particularly preferred blend of the materials is from 75-85 percent, by weight, of the thermoplasic material and from 15-25 percent, by weight, of the carbon black particles. An especially preferred blend is approximately 83 percent, by weight, of the thermoplastic material and approximately 17 percent, by weight, of the carbon black particles. The most preferred enclosure composition is from 75-85, preferable 83, percent, by weight, of polyethylene blended with from 15-25, preferably 17 percent, by weight, of carbon black particles. Of course, small amounts of additives which serve to enhance the processability of the composition may be included as is well known to those in the art. An example of such additives are mold release additives.

The two materials are blended within the prescribed weight ratios and heated to a temperature whereby the thermoplastic material may be extruded as a parison and blow molded into the desired shape or configuration as is well known in the art. The incorporation of the carbon black particles, which themselves are electrically conductive, within the thermoplastic material renders the material or blend electrically conductive as is desired by the present invention.

Returning to FIG. I it can be seen that the portable work station or container 1 comprises a top enclosure means 2 and a bottom enclosure means 3. Top enclosure means 2 and bottom enclosure means 3 are connected by flexible hinge means 4 (see FIGS. V and VII). Container 1 may be opened and closed by rotating top enclosure 2 about the axis of hinge means 4. Upon closing of container 1 the top enclosure means 2 and bottom enclosure means 3 are brought into close intimate contact and are interfaced along parting line 5. Container 1 may also contain a flexible latching means 6 for releasably securing top enclosure means 2 to bottom enclosure means 3. Preferrably the flexible latch means 6 includes a latch gripping tab or extension 7.

Various portions or surfaces of container 1 may also be provided with label areas 8. The label areas may be shaped and sized so as to match up with labels (not shown) which may be adhesively applied to the area. Preferrably one or more of the areas 8 are slightly recessed or sunken. Alternatively logos or other trade indicia may be included within the areas 8. If the area is recessed, the logo may be raised above the recessed surface.

Container 1 also includes an electrical charge bleed-off or grounding means 9 which, preferably, is located on bottom enclosure means 3. However, location of means 9 on top enclosure means 2 is possible. Electrical charge bleed-off means 9 may be attached to bottom enclosure means 3 by way of a well-known male-female arrangement. However, any means of attachment is satisfactory so long as the connection assures that means 9 and enclosure 3 are in electrically conductive communication. Bleed-off means 9 is also formed from an electrically conductive material such as, for example, any electrically conductive metal (e.g. copper, aluminum etc.). The function of bleed-off or grounding means 9 will be more fully described hereinafter.

FIG. I also discloses that container or work station 1 comprises a window or interior viewing means generally designated as at 10. More particularly, window means 10 comprises a sheet of optically transparent material 11 which is incorporated within, for example, top enclosure means 2 by a frame-like retaining and engaging means 12. Frame-like retaining and engaging means 12, likewise, is manufactured from an electrically conductive composition such as those described above with regard to means 2 and 3. Preferably, means 12 is manufactured from the same composition as means 2 and 3. The presence of window means 10 in the top enclosure means 2 allows the interior of container 1 and any contents located therein to be examined without opening the container and subjecting the contents to the harmful effects of an external electrical field.

FIG. V is a top plan view of the electrically conductive container of FIG. I wherein the optically transparent sheet 11 and the frame-like sheet engaging and retaining means 12 have been removed. Removal of sheet 11 and engaging and retaining means 12 more clearly reveals the presence of orifice 23 in container top enclosure means 2. Orifice 23 is peripherally surrounded by window means recess area 22. The surface of area 22 is recessed from the surface of means 2. A group of holes 17 are located in window means recess 22. Holes 17 serve to receive and retainingly engage the legs 19 (see FIGS IX, X, and XI) of sheet engaging and retaining means 12. Accordingly, to assure firm engagement of legs 19 in holes 17, the diameter of holes 17 should be equal to or slightly less than the diameter of legs 19. Alternatively, the length of legs 19 could be greater than the depth of holes 17 and the ends of legs 19 could be enlarged so that the legs 19 snappingly engage holes 17. The number of holes 17 is not important. However, a sufficient number of holes 17 and associated cooperating legs 19 should be provided so that engaging and retaining means 12 can trappingly retain sheet 11 between means 12 and window means recess 22 of container top enclosure 2.

The structure of sheet engaging and retaining means 12 is clearly disclosed in FIGS. VIII, IX, and X. FIG. VIII, which is a top plan view of means 12, shows the preferred frame-like configuration of means 12 which surrounds opening 18. FIG IX, which is a cross-sectional view of means 12 taken along line A—A as indicated in FIG. VIII, discloses a preferred leg 19 configuration of means 12. In this configuration means 12 comprises six legs 19 four of which are individually located in a respective corner of means 12. The remaining two legs 19 are centrally located along the longer side of means 12. FIGS. IX and X disclose a preferred aspect of retaining and engaging means 12. These figures disclose that, preferrably, retaining and engaging means 12 comprises a sheet retaining indent 20 which is sized so as to have a depth "c" substantially equal to the thickness of sheet 11. Additionally, sheet retaining indent 20 has longitudinal and lateral dimensions euivalent to or slightly larger than that of sheet 11. This arrangement is most clearly depicted in FIG. XI wherein sheet 11 is depicted as having a lateral dimension equal to or slightly less than the lateral dimension of sheet retaining indent 20. In particular, FIG. XI, which is an exploded view, discloses a method of assembling window means 10. Sheet 11 is dimensioned so at to be both laterally and longitudinally greater in size than the orificce 23 of top enclosure means 2. However, the longitudinal and lateral dimension of sheet 11 should not be so great that sheet 11 obstructs or occludes holes 17. Furthermore, window recess area 22 preferrably should be recessed a distance "d" from the top surface of top enclosure means 2. Distance "d" is substantially equivalent to the thickness (not counting legs 19) of means 12. Accordingly, upon full insertion of legs 19 into holes 17 the top surface of means 12 should be in a substantially planer configuration with the top surface of top enclosure means 2. If window sheet 11 is placed on window means recess 22 prior to coupling of means 12 to recess means 22 of top enclosure 2, window sheet 11 will be snuggly and securely engaged and retained within window retaining indent 20. Furthermore, there will be substantial physical contact between retaining and engaging means 12, top enclosure means 2 (as at 22), and the external surfaces of sheet 11. This substantial contact is critical to assure that sheet 11, means 12 and top enclosure means 2 are in electrically conductive communication with one another. Furthermore, surface contact between means 12, sheet 11 and window recess means 22 is especially critical in the instance wherein sheet 11 comprises an electrically non-conducting material which has been coated on one or more of its surfaces with an electrically conductive material. Such a configuration is clearly demonstrated in FIG. XII which is a cross-sectional view of sheet 11 that has been highly enlarged for illustrative purposes.

FIG. XII discloses that sheet 11 may comprise a material which is an electrically non-conductive material as at 24. This material may be coated on one or both surfaces by an electrically conductive material 25. The presence of electrically conductive material 25 on one or more surfaces of material 24 allows electricity to freely flow and be conducted along the surface of sheet 11. If he electrically conductive coating 25 is in electrically conductive communication with electrically conductive means 12 and electrically conductive top enclosure means 2 it can be readily appreciated that the entire surface of container 1 will be electrically conductive and the interior of the container will be completely surrounded and thus shielded by an electrically condutive surface when the container is closed. The present electrically conductive engaging and retaining means 12 which trappingly retains sheet 11 in good physical contact with both of means 12 and top enclosure 2 by way of window recess 22 accomplishes this goal. Furthermore, the structure may be easily and economically manufactured.

The efficiency and importance of the present structure becomes more apparent when one realizes that many of the optically transparent materials which are generally utilized for window sheets or panes are not electrically condutive. Accordingly, these materials, for example, polycarbonates and glass, must be coated with an electrically conductive coating to render the entire surface of the container electrically conductive. Polycarbonates are especially preferred because of their high optical transparency and low weight. Polycarbonates are synthetic thermoplastic resins produced by reacting bisphenol A and phosgene. The material is highly transparent having a 90% or greater light transmission parameter. A preferred polycarbonate is commercially obtainable under the trade name Lexan from the General Electric Company. In these instances, e.g. when coatings are used, electrically conductive communicative contact between the electrically conductive costing and the remainder of the electrically conductive enclosure is assured by the present configuration.

Many means for providing an electrically conductive coating onto a non-conducting surface are known. One presently preferred means whereby a high voltage is applied between an anode and a cathode of a plating metal is known as cathode sputtering. In cathode sputtering the cathode is vaporized by positive-ion bombardment, with some of this vapor diffusing away from the cathode and depositing onto the object to be coated. The voltage required for sputtering varies from 500–2000 volts depending on the nature of the cathode metal. The emitting cathode remains relatively cool during the process which is carried out within an airtight sputtering chamber. Basically the chamber is fitted with a small anode, a large cathode, and a fixture near the cathode to hold the object to be sputtered. A vacuum is applied to the chamber and pressures of 0.01–0.10 mm. of mercury are generally necessary to maintain a proper glow discharge. The vacuum system is operated continously with the required chamber pressure being maintained by regulation of a bleeder valve. Silver and copper are among the easiest metals to sputter. However, a preferrable sputter coating material which results in a high degree of optical transparency after sputtering is an indium tin oxide. Other methods of coating an electrically conductive material onto a sheet material such as, for example, glass are well known and disclosed in the art. Exemplary of these materials and processes are U.S. Pat. Nos. 4,369,208 to Okunaka; 4,303,554 to Sudo and 4,268, 539 to Nakayama. These documents are hereby incoporated by reference.

As was previously stated, a preferred embodiment of the present invention includes an internal pad, preferrably a foam anti-static pad, made of an electrically conductive material which reduces or eliminates the generation and accumulation of internal static electricity. A preferred material for the pad is known in the art "pink poly". This material is a polyethylene which has been impregnated with an organic liquid which acts as a hydroscopic "wetting agent" which attracts and holds moisture onto the surface of the surface of the pad to render the pad electrically conductive. Alternatively, the pad could be formed from an electrically conductive loaded plastic foam such as a carbon or aluminum loaded polyurethane foam. This material is available in commercial volumes and is electrically conductive throughout as opposed to merely having an electrically conductive surface coating. Yet another type of conductive pad is a polyethylene foam which has been sprayed with a conductive carbon or similiar conductive solution to effect a conductive layer on the surface of the material.

The internal pad is not illustrated in the drawings since utilization of such an internal pad is well known to those in the art. Preferrably, the pad may be preformed or shaped to the configuration of the electrically sensitive devices which may then be securely held thereby. Additionally, the pad is shaped and inserted into the container so as to be in electrically conducctive communication with the electrically conductive enclosure means of the container. As a result of the conductivity of the internal pad and its electrically conductive communication with the container, any static charge which might be generated by frictional movement or other slight vibrations of the electrically sensitive device against the pad will immediately be conducted to and, if the container is not grounded, reside on the external surface of the container for reasons stated earlier. Moreover, it is believed that the presence of a moist surface on the pad reduces the generation of friction and the accompanying static forces. Accordingly, the internal pad having a moist electrically conductive surface resulting from the presence of a wetting agent is preferred due to the dual function of this surface. Numerous hydroscopic wetting agents are known to those of skill in the art and the invention is not meant to be limited to utilization of any particular type of wetting agent. However, for purposes of illustration U.S. Pat. No. 3,355,313 to Eastes and Canadian Pat. No. 810,595 also to Eastes disclose exemplary wetting agents. These documents are hereby incorporated by reference.

Another possible and also known method for rendering plastic materials, both foamed and non-foamed, anti-static is the dispersal of an anti-static agent throughout the plastic. Initially, since continuity of the agent throughout the plastic is lacking, the anti-static properties are not good. However, in time the agent migrates to the surface of the material much like the phenomenen known as migration (sweating) of incompatible plasticizers. Thus, after a period of time, a good conductive anti-static coating is formed. A recommended compound of this sort is: stearamidopropyl-dimethyl-2-hydroxyethylammonium nitrate, a cationic surface-active agent having the following structure:

Thus, it can be seen that numerous mechanisms for rendering a material anti-static and/or conductive are known.

Yet another aspect of the present electrically conductive work station is the provision of an electrical charge bleed-off or grounding means 9 which is in electrically condutive communication preferrably with bottom enclosure means 3 of container 1. Means 9, likewise, is formed from an electrically conductive material such as, for example, copper, aluminum or another conductive metal. Means 9 may take the form of a snap juncture or, alternatively, it may merely assume a pole or rod-like configuration to which clipping means such as, for example, and alligator clip may be attached. A snap engaging configuration is preferred since a more positive physical and electrical connection is made thereby.

The function of bleed-off means 9 is to afford a means for the easy attachment of an electrically conductive wire thereto. In use, one end of the wire is attached to means 9 and the other end of the wire is attached to a like or similiar means which is attached and in electrically conductive communication with the machine or other device which is to be repaired in the field. Accordingly, any differential of electrical charge which may exist between the container and the machine will be equalized upon attachment of one end of the wire to means 9 and the other end to an equivilant means which is attached to the machine since the charge will flow, in the appropriate direction, to equilibrate. In this manner the charge, if any, existing on the electrically sensitive device will be equalized to that existing on the machine into which the device is to be incorporated. Thus, if the repair individual maintains consistant physical/electrically conductive communicative contact with the machine to be repaired, (i.e. grounds himself with respect to the machine). The electrically sensitive device will not be subjected to the adverse effects of uncontrolled electrical flow or discharge upon being incorporated within the machine which is to be repaired.

In summary, it can be seen that the presently described portable work station performs many useful functions. One significant function is the field transportation of an electrically sensitive device to an on-site location while continuously shielding the interior 16 of the container 1 and any device contained therein from the harmful effects of external electrical fields. For purposes of illustration FIG. III schematically demonstrates the penetration of the interior 16 of an electrically non-conductive container by an external electromagnetic or electricstatic field. As stated above such penetration could well adversely affect the electrical functioning of an electrically sensitive device subjected to such field. In stark contrast to the penetration schematically illustrated in FIG. III, FIGS. II and IV schematically illustrate the shielding effect which the present conductive case affords its interior 16 and any devices contained therein when the container is placed in an electromagnetic field (FIG. II) or an electrostatic field (FIG. IV). In FIGS. II, III, and IV the electrical fields are represented by electrical lines of force 15 well-known to those in the art.

FIGS. II, III, and IV illustrate a preferred embodiment in cross-section wherein the container 1 is a double-wall blow-molded container having outlet wall 13 and inner wall 14. A double-wall construction is preferred to afford a greater degree of physical protection to the contents. As has been previously stated the art of blow molding, both single and double wall, is well known to those of skill in the art. While a double-wall construction is preferred, a single-wall construction may also be utilized.

An additional significant function which the present conductive container performs is the bleeding-off of any internally generated static electrical charge from the electrically sensitive device to the surface of the container. Such action removes the electrical charge from the vicinity of the electrically sensitive device thereby protecting the device from the possible adverse harmful effects of the charge. This charge and any other charge which may have been built up on the surface of the portable work station as a result of transportation of the work station (e.g. static from the repair technician walking) may be grounded by means of bleed-off means 9. That is, bleed-off means 9 may serve to electrically equilibrate any charge differential which may exist between the electrically sensitive device and the machine into which it is to be incorporated.

Lastly, it is to be noted that the present portable work station provides an electrically conductive window means whereby the interior of the container may be viewed without opening the container and thereby subjecting the contents of the container to the harmful effects of external electrical forces.

Although the present invention has been described with preferred embodiments, it is to be understood that modifications and variations may be resorted to without departing from the spirit and scope of the present invention. For example, the container does not necessarily have to be formed by blow molding since any other appropriate means for formation is satisfactory. Additionally, numerous other anti-static and/or electrically conductive materials, all well known to those in the art, may be utilized to effect the desired results. As those skilled in the art will readily understand, such variations and modifications are considered to be within the purview and scope of the appended claims.

I claim:

1. A portable work station adapted to transport a device sensitive to electrical forces, said work station comprising:
   a double walled electrically conductive enclosure defining an orifice and an interior, said enclosure comprising electrically conductive window means for viewing said interior through said orifice;
   wherein said electrically conductive window means comprises:
      window recess means completely surrounding said orifice and having at least one hole located therein; a sheet of optically transparent electrically non-conductive material located in said window recess means and completely covering said orifice, said sheet having an electrically conductive surface; and
      an electrically conductive frame-like structure maintaining electrically conductive communication between said enclosure and said surface comprising:

at least one leg, said leg being inserted into said hole and a sheet retaining indent retaining engaging said sheet to said window recess means;

whereby the interior of said closure is shielded from external electrical forces.

2. The portable work station of claim 1 further comprising electrically conductive anti-static pad means located within said interior;

electrically conductive grounding means; and wherein said window means, said pad means and said grounding means are in electrically conductive communication with said enclosure means.

3. The portable work station of claim 1, wherein said electrically conductive enclosure means comprises a blend of from 75–85 weight percent polyethylene and from 15–25 weight percent electrically conductive particles.

4. The portable work station of claim 1, wherein said electrically conductive enclosure means comprises a blend of from 75–85 weight percent polyethylene and from 15–25 weight percent of aluminum particles.

5. The portable work station of claim 3, wherein said electrically conductive particles comprise carbon black particles.

6. The portable work station of claim 3, wherein said electrically conductive particles comprise aluminum particles.

7. The portable work station of claim 1, wherein said optically transparent electrically non-conductive material comprises a polycarbonate.

8. The portable work station of claim 1, wherein said frame-like structure comprises a blend of from 75–85 weight percent polyethylene and from 15–25 weight percent of carbon black particles.

9. The portable work station of claim 1, wherein said electrically conductive surface comprises a sputter coating of indium tin oxide.

10. The portable work station of claim 2, wherein said pad comprises a foamed polyethylene loaded with carbon black particles.

11. The portable work station of claim 2, wherein said pad comprises a hydroscopic wetting composition located on the surface thereof.

12. The portable work station of claim 2, wherein said pad is foamed, shaped, and contoured to the shape of at least one electrically sensitive device.

13. The portable work station of claim 8, wherein said electrically conductive surface comprises a sputter coating of indium time oxide.

* * * * *

UNITED STATES PATENT AND TRADEMARK OFFICE
CERTIFICATE OF CORRECTION

PATENT NO. : 4,494,651

DATED : 1-22-85

INVENTOR(S) : Donald A. Malcolm

It is certified that error appears in the above-identified patent and that said Letters Patent is hereby corrected as shown below:

In column 13, line 3, delete the second occurrence of "retaining", substituting therefor --retainingly--.

In column 13, line 5, delete "closure" substituting therefor --enclosure--.

Signed and Sealed this

Sixteenth Day of July 1985

[SEAL]

Attest:

DONALD J. QUIGG

*Attesting Officer*    Acting Commissioner of Patents and Trademarks